United States Patent
Eifert

(10) Patent No.: US 10,145,901 B2
(45) Date of Patent: Dec. 4, 2018

(54) METHOD FOR THE MANAGEMENT OF THE ELECTRICAL CURRENT SUPPLY IN A MOTOR VEHICLE

(71) Applicant: FORD GLOBAL TECHNOLOGIES, LLC, Dearborn, MI (US)

(72) Inventor: Mark Eifert, Hessen (DE)

(73) Assignee: Ford Global Technologies, LLC, Dearborn, MI (US)

( * ) Notice: Subject to any disclaimer, the term of this patent is extended or adjusted under 35 U.S.C. 154(b) by 361 days.

(21) Appl. No.: 14/711,122

(22) Filed: May 13, 2015

(65) Prior Publication Data

US 2015/0331060 A1    Nov. 19, 2015

(30) Foreign Application Priority Data

May 15, 2014   (DE) .................. 10 2014 209 252

(51) Int. Cl.
| | |
|---|---|
| H02J 7/00 | (2006.01) |
| G01R 31/36 | (2006.01) |
| H02J 7/14 | (2006.01) |

(52) U.S. Cl.
CPC ..... *G01R 31/3675* (2013.01); *G01R 31/3693* (2013.01); *H02J 7/1446* (2013.01); *Y02T 10/7005* (2013.01); *Y02T 10/92* (2013.01)

(58) Field of Classification Search
USPC .................. 320/132, 109, 135, 155
See application file for complete search history.

(56) References Cited

U.S. PATENT DOCUMENTS

| 5,820,172 A | 10/1998 | Brigham et al. |
|---|---|---|
| 6,646,419 B1 | 11/2003 | Ying |
| | (Continued) | |

FOREIGN PATENT DOCUMENTS

| DE | 10150374 A1 | 4/2003 |
|---|---|---|
| DE | 102004023621 | 12/2005 |
| | (Continued) | |

OTHER PUBLICATIONS

Ballichi et al., "Automotive Engine Controls and Hybrid Systems: Challenges and Opportunities", Proceedings of the IEEE, Jul. 2000, 49 pgs.

*Primary Examiner* — Brian Ngo
(74) *Attorney, Agent, or Firm* — Frank A. MacKenzie; Brooks Kushman P.C.

(57) ABSTRACT

This disclosure relates to a method for the management of the electrical current supply in a motor vehicle having a combustion engine, wherein the charge state of a battery is detected and characterized as a discrete variable that indicates whether the prevailing charge state is below or above a calibrated threshold value. If the discrete variable indicates that the prevailing charge state is below the calibrated threshold value, the battery is charged using a relatively high voltage over a predetermined time period in such a manner that all cells of the battery are charged. If the discrete variable indicates that the prevailing charge state is above the calibrated threshold value, different temperature-dependent voltage set points of an electric generator in the vehicle are set in dependence upon a prevailing energy conversion efficiency level of the drivetrain that is detected and characterized as a further discrete variable.

11 Claims, 3 Drawing Sheets

(56) References Cited

U.S. PATENT DOCUMENTS

| | | | |
|---|---|---|---|
| 8,159,188 B2 | 4/2012 | Anderson | |
| 8,638,070 B2 | 1/2014 | Maluf et al. | |
| 2004/0008031 A1* | 1/2004 | Arai | H01M 10/48 |
| | | | 324/429 |
| 2013/0033237 A1* | 2/2013 | Kim | B60L 1/00 |
| | | | 322/25 |
| 2013/0229154 A1* | 9/2013 | Benjamin | G01R 31/3606 |
| | | | 320/132 |
| 2013/0320931 A1* | 12/2013 | Yoshida | B60R 16/033 |
| | | | 320/135 |
| 2014/0236379 A1* | 8/2014 | Masuda | H01M 10/44 |
| | | | 700/297 |
| 2015/0197159 A1* | 7/2015 | Lee | B60L 11/1851 |
| | | | 701/22 |

FOREIGN PATENT DOCUMENTS

| | | |
|---|---|---|
| DE | 102005046342 A1 | 4/2007 |
| DE | 60033861 T2 | 11/2007 |

* cited by examiner

METHOD FOR THE MANAGEMENT OF THE ELECTRICAL CURRENT SUPPLY IN A MOTOR VEHICLE

CROSS-REFERENCE TO RELATED APPLICATION

This application claims foreign priority benefits under 35 U.S.C. § 119(a)-(d) to DE 10 2014 209 252.3, filed May 15, 2014, which is hereby incorporated by reference in its entirety.

TECHNICAL FIELD

The invention relates to a method for the management of the electrical current supply in a motor vehicle having a combustion engine and a device that is designed so as to implement the method.

BACKGROUND

DE 10 2004 023 621 A1 discloses a method and device for determining the energy content of an energy storage device. Said document describes a concept for determining the charge state of a battery in a vehicle but does not mention a strategy for correcting a low charge state or for improving the efficiency level of the electrical system or drive. The charge state is continually estimated and output as a precise numeric value. The estimation of the charge state can be corrected by means of galvanically decoupling the battery from the electrical power source. The correction can be applied periodically or it can be scheduled in a sporadic manner if a favorable driving section lies ahead. The correction is implemented by means of measuring the no-load voltage of the battery. The charge state is a function of the no-load voltage if there has not been any load on the battery for a sufficiently long period of time. The charge state is determined by means of integration of the battery current between the correction processes. The charge state is used as the initial value of the integration process after said charge state has been corrected (measuring the no-load voltage and determining a charge state).

U.S. Pat. No. 6,646,419 B1 discloses a method for determining the charge state of a lead acid battery in a vehicle. This method also continuously estimates the charge state and outputs the result as a precise numeric value. Also, the charge state is determined by means of integrating the charging current or the discharging current respectively. The secondary battery current that is involved in the gas formation and the heating up of the battery is calculated but not stored. The difference between the total battery current and the secondary battery current produces the charging current or discharging current that is integrated in the case of determining the charge state. Also, the initial value of the charge state is determined from the no-load voltage of the battery following a phase where the battery current is zero or low. If the vehicle has been switched off for a long period of time, a new value is calculated for the initial value of the charge state from the no-load voltage. This document also describes that the initial value of the charge state can be corrected during the driving operation. The no-load voltage of the battery is estimated using the measured battery current after a long phase where the battery current is zero. The document does not describe in detail if the estimated terminal voltage is used in order to correct the initial charge state.

U.S. Pat. No. 8,159,188 B2 discloses a method for controlling the charge state of a lithium ion vehicle battery so that it is also always possible to achieve a minimum discharging current value. The method ensures in aging batteries that said batteries can always deliver sufficient discharging current. The charge state of the battery is maintained at a value between a minimum and a maximum charge state. If it is determined that a required discharging current cannot be achieved, the minimum charge state is increased in a part load operation. The increase is a function of the difference between the required current and the supplied current, the battery temperature, the charge state and other battery conditions.

U.S. Pat. No. 8,638,070 B2 discloses a method for adaptively charging a battery to a desired value. The charge state is estimated and output as a precise numeric value. The estimation is performed by means of actively controlling the terminal voltage of the battery by means of a sequence of charging and discharging pulses. The pulses have a predefined current profile and the voltage response of the pulses are used in order to estimate the charge state. The charging or discharging pulses respectively must generate voltage responses within narrow tolerances. Their exact form is continuously adapted so that the responses remain within the tolerances. The pulses are always implemented periodically or rather independently from the operating state of the entire system. Due to the fact that the voltage response to a predetermined current is used in order to estimate the charge state, a relationship between the equivalent capacitances of the battery and the charge state are used in order to perform the estimation. This method was developed for lithium ion batteries and it is intended that it can also be used for other battery types such as Ni-MH. However, there is no mention of lead acid batteries.

SUMMARY

The object of the invention is to provide a method for the management of the electrical current supply in a motor vehicle having a combustion engine, said method rendering it possible with minimal outlay to detect and correct not only a lower battery charge state and consequently to achieve electrical robustness but also to improve fuel consumption and to reduce $CO_2$-emissions.

This object is achieved by virtue of the method and a device in accordance with the independent patent claims.

Advantageous embodiments of the invention are disclosed in the dependent patent claims.

The invention provides an operating strategy for the electric generator of a motor vehicle that can minimize the fuel consumption and ensure electrical robustness. Electrical robustness is ensured by means of implementing an algorithm for a discrete recognition of a low charge state.

Within the scope of the invention, the charge state is compared periodically or in dependence upon the driving operation with a predetermined value in order to obtain a discrete and in particular binary initial variable in the form of a bit or a flag that indicates whether the charge state is below a predetermined threshold. If the electrical current source is not saturated between the comparison processes, it is assumed that the charge state does not reduce between the points in time at which the check is performed. In this case, the state of the bit or flag is not changed. In other words, the method in accordance with the invention does not output a numeric value for the charge state, and the energy content of the battery is also not directly determined or estimated.

In a preferred embodiment of the invention, a comparison is performed between the charge state and a predetermined value by means of a periodic or sporadic reduction in the terminal voltage of the battery. The battery current is determined directly or indirectly during a time window in order to determine whether the charge state is greater than or less than a value that is a function of the reduced voltage.

The method in accordance with the invention renders it possible to characterize a low charge state in a simple manner and at the same time improve the efficiency level of the electrical current supply and consequently the entire drive of the vehicle.

If a low charge state is identified, a corresponding flag is set and the battery is charged using a relatively high voltage during a predetermined time frame. The relatively high voltage and the predetermined time frame are a compensating charge voltage and a compensating charge time period that are necessary in order to charge all the cells of the battery uniformly to 100% of their capacity. The most favorable charging operation with respect to fuel consumption is repeated at the end of the compensating charge time period.

As mentioned above, comparisons are performed between the charge state and a predetermined value by means of periodically or sporadically reducing the terminal voltage of the battery. If the comparisons are performed in a sporadic manner, said comparisons are generated in dependence upon the driving conditions. It is particularly expedient to allow all the comparisons to be performed after a phase of a regenerative braking operation if the motor is in the no-load state. The voltage change can occur suddenly or with a time gradient. During the reduction process, the terminal voltage, the battery current or the current from the electrical current source (of the electric generator including inverter) is compared with zero. If the current of the electrical current source is always zero or is identified as being a discharging process, the charge state is identified as being above the predetermined threshold. The current response of the battery or rather of the electrical current source during periodic or sporadic discharging process decides whether the charge state is above or below the predetermined threshold. This strategy is particularly suitable for lead acid batteries. Since lithium ion batteries have similar equivalent switching models, the strategy can however possibly also be used for this type of battery.

The reduction in the fuel consumption and the reduction of the $CO_2$ emissions achieved by means of the invention are in part as a result of foregoing the generation of electrical power in operating phases where the efficiency level is low in the case of the power conversion. The electric generator is deactivated during these operating phase and the battery discharges itself. The ability of the battery to discharge contributes to the advantages and this ability deteriorates generally at a lower rate than the aging process of the battery.

A description of the exemplary embodiments with reference to the drawings is provided hereinunder. In the drawings:

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

The minimal current supply management strategy described herein for the management of the electrical current supply in a motor vehicle having a combustion engine and a regenerative braking system comprises two parts that are used alternatively: one strategy that determines the voltage set point of the electric generator for the current required on board with respect to improving the fuel consumption and the efficiency level of the drivetrain when converting energy, and one strategy that monitors the battery charge state and in the event that the battery charge state is identified as being low charges the battery to a higher voltage at a set point.

The current supply management strategy described herein is referred to as 'minimal' because said strategy can be performed with minimal outlay, it always ensures an at least minimal charge state and in addition contributes to the fuel consumption being minimized.

The term 'electric generator' includes in this case not only an electric motor that is operating as a generator but also the inverter that generates therefrom a direct voltage and can be controlled so as to supply a desired output voltage, so that the output voltage of the electric generator can be set within specific limits.

The part of the total strategy that monitors the battery charge state and alleviates a low charge state by extending the charging process, and in fact as close as possible to 100% of its capacity, which is referred to hereinunder as mitigation, can be referred to as the strategy for electrical robustness. In the event of a low charge state, this strategy cancels a voltage set point that is determined possibly by means of the strategy for improving the energy conversion efficiency level and therefore represents the highest priority in the hierarchy for the selection of the voltage set point of the electric generator.

In hybrid vehicles and electric vehicles, the low voltage supply is frequently provided by way of a direct voltage converter that is supplied with energy from a high voltage network. In this case, it is possible to implement the part of the invention that monitors the battery charge state also in these vehicles by means of activating a suitable voltage set point of the direct voltage converter in order to ensure the electrical robustness of the low voltage supply.

Figure 1:
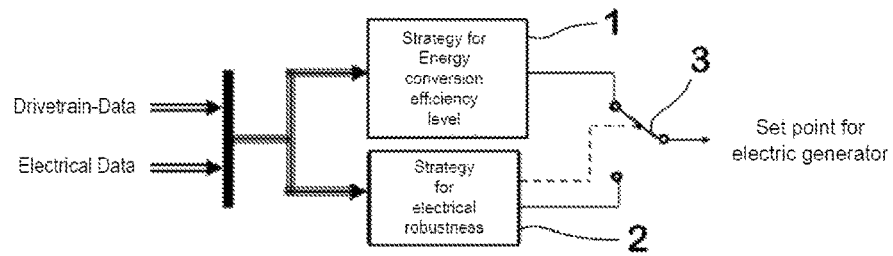
FIG. 1 illustrates an overview of an electric generator control architecture having a battery management system.

FIG. 1 illustrates an overview of an electric generator control architecture having a battery management system, in other words the architecture for controlling the selection of the strategy for determining the voltage set point of the electric generator, and illustrates the combination of a strategy 1 for improving the energy conversion efficiency level and using a strategy 2 for electrical robustness in a combined control architecture. The two strategies are based on data from a drivetrain and also data from the vehicle electronics system.

A virtual switch 3 in FIG. 1 that controls the origin of the voltage set point of the electric generator reflects the dual responsibility of the minimal current supply management strategy, namely to improve the fuel consumption and reduce $CO_2$ emissions and to maintain the robustness of the electrical current supply. The broken line between the virtual switch 3 and the strategy 2 for electrical robustness illustrates the priority of the latter in the hierarchy for the selection of the voltage set point.

The strategy 1 for improving of the energy conversion efficiency level is described hereinunder in two sections. In the first section, the selection of the voltage set point of the electric generator is described with regard to the operating mode according to the efficiency level, in other words with regard to the energy conversion efficiency level of the drivetrain in the currently prevailing operating mode, and the identification of the operating mode of the drivetrain (high level of efficiency, low level of efficiency or regenerative braking system) is described in the second section.

In order to select the voltage set point of the electric generator with regard to the operating mode according to the efficiency level, a voltage set point that is dependent upon the battery temperature is selected once the vehicle has been put into operation in dependence upon the operating mode of the drivetrain. During the operation of a combustion engine, two operating modes are possible, namely having a high level of efficiency or a low level of efficiency. A third operating mode relates to the situation in which a deceleration occurs in the case of a non-fired combustion engine. The drivetrain control strategy for non-fired decelerations is generally referred to as a DFSO (deceleration fuel shut off).

Figure 2:
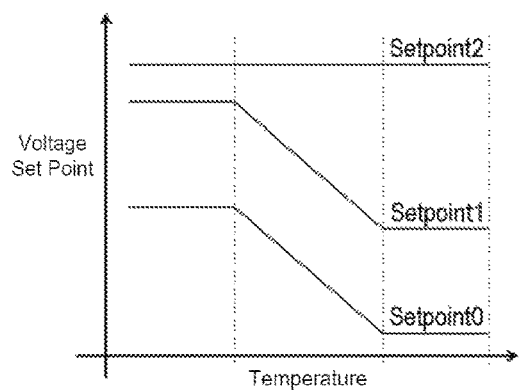
FIG. 2 illustrates the dependence of the voltage set points upon the temperature for operating the drivetrain at different levels of efficiency.

Each of the three operating modes can be allocated a distinct function of the voltage set point based on the temperature of the battery. FIG. 2 illustrates the dependence of the voltage set point upon the temperature for operating the drivetrain in the case of a high level of efficiency, a low level of efficiency or a regenerative braking operation respectively.

The function of the operation having a high level of efficiency is referred to in FIG. 2 as Setpoint1. A function of this type of the temperature-dependence voltage that is used in the case of conventional charging strategies to charge a battery is described as a Z-curve owing to its shape and can be defined by the battery manufacturer. The function Setpoint1 can reflect the temperature-dependent voltage characteristic curve that is used in order to fully charge a starter battery, which supplies the current for the starter, ignition and lighting, using a conventional strategy to control the current supply and said function is also referred to as a setting point for high (in other words relatively high) voltage.

The Z-curve for the operation having a low level of efficiency is referred to in FIG. 2 as Setpoint0. Said curve can be calibrated so that it is lower than the Setpoint1 over the entire temperature range by 0.3 to 1 volt and the lowest value, namely the value for a high battery temperature, should be greater than the no-load voltage of a battery having a charge state that is minimal but yet still regarded as being sufficient.

If the voltage set point changes from Setpoint1 to Setpoint0, the electric generator is relieved of the load of the on-board current supply and the battery discharges until the equilibrium defined by Kirchhoff laws is achieved. The electric generator is therefore discharged over a period of time the length of which is proportional to the vehicle load current if the efficiency level changes from high to low.

If a deceleration occurs in the case of a non-fired combustion engine, it is possible to use either Setpoint1 or optionally a higher voltage set point that is referred to as the Setpoint2. Depending upon the use, the Setpoint2 can be a temperature-dependent value or a constant, non-temperature-dependent value. Since Setpoint2 is greater than Setpoint1, the battery always starts to charge if the voltage set point changes from Setpoint1 to Setpoint2, and said battery consequently reserves an energy buffer for a regenerative braking operation in the case of a non-fired combustion engine.

Algorithms are now described for selection, by means of which the functions Setpoint0, Setpoint1 and Setpoint2 of the voltage set point, illustrated in FIG. 2, is to be determined.

Figure 3:
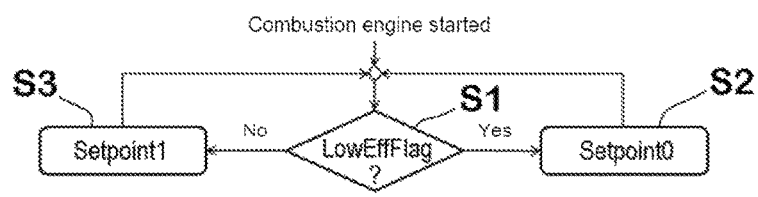
FIG. 3 illustrates the process of selecting the voltage set point for operating modes that have a high level of efficiency and a low level of efficiency.

FIG. 3 illustrates the selection of the voltage set point for operating modes having a high level of efficiency and a low level of efficiency with reference to a very simple selection algorithm for two operating modes, namely having a high level of efficiency and a low level of efficiency. After the engine start-up, the algorithm for the selection of the voltage set point monitors (S1) a flag for the efficiency level and, if a flag LowEffFlag for a low level of efficiency is activated, selects a comparatively low voltage set point Setpoint0 (S2). Otherwise, a comparatively high voltage set point Setpoint1 is selected (S3). If two temperature-dependent voltage set points are used, a non-fired deceleration can be identified as an operating mode having a high level of efficiency.

Figure 4:
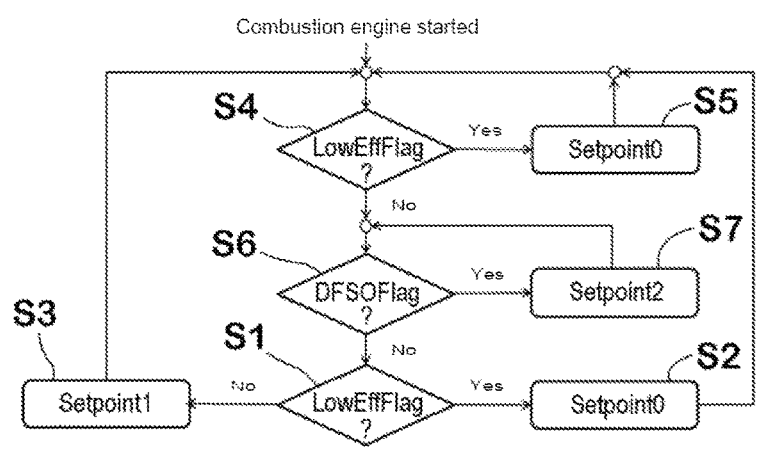
FIG. 4 illustrates the process of selecting the voltage set point for operating modes that have a high level of efficiency and a low level of efficiency and also for non-fired decelerations.

FIG. 4 illustrates the selection of the voltage set point for operating modes having a high level of efficiency and a low level of efficiency and also for non-fired decelerations in the form of an expansion of the algorithm illustrated in FIG. 3 for the selection of the voltage set point in that for non-fired decelerations an additional voltage set point Setpoint2 is defined that is higher than the Setpoint1. Depending upon whether the LowEffFlag is activated or not (S4), either the Setpoint0 is selected (S5) or prior to the step S1 in FIG. 3 a check is also performed (S6) as to whether a flag DFSO-Flag for the highest level of efficiency is activated, in which case a non-fired deceleration is identified and the voltage set point Setpoint2 is selected (S7).

The process of identifying whether the drivetrain is functioning in an operating mode having a high level of efficiency or a low level of efficiency is performed along the lines of the engine control strategies that are active during the operation of the vehicle. It is therefore possible to identify operating modes that correspond to the no-load controller, the deceleration controller, the switching controller and the controller for the management of the forward-thrust torque and these operating modes can be classified in dependence upon their typical calibration as a high level of efficiency or a low level of efficiency. The operating modes can be further subdivided if the corresponding energy conversion efficiency level varies considerably.

In the case of an Otto engine, the energy conversion efficiency level is a function of the ignition advance and of the air-fuel ratio as described in the following formula:

$$BMEP = G_f q \eta(\varphi), \text{ wherein}$$

BMEP represents the mean pressure in the cylinder during the combustion cycle (Brake Mean Effective Pressure), q represents the quantity of injected fuel (fuel mass flow), $G_f$ represents a yield factor dependent upon the air/fuel ratio, and $\eta/(\varphi)$ represents the ignition efficiency level function (efficiency level with regard to the ignition advance $\varphi$), cf. Ballichi, Benvenuti, Di Benedetto, Pinello, Sangiovanni-Vincentelli "Automotive Engine Controls and Hybrid Systems: Challenges and Opportunities", Proceedings of the IEEE, July 2000.

Once the combustion engine has warmed up, the air/fuel ratio is held at a value close to a stoichiometric value but the ignition advance is changed to less efficient values ($\eta(\varphi) < 1$). It is therefore possible to classify the operating mode with regard to the energy conversion efficiency level with regard to the ignition efficiency level function.

The ignition-efficiency level function is at its maximal value if the highest mean pressure in the cylinder (BMEP) is achieved for a given air/fuel ratio. In the case of this maximal value, it is said that the ignition advance has the set value MBT (Mean Best Torque). In some operating modes, the engine calibration intentionally selects ignition advance values that do not correspond to the MBT in order to ensure a torque reserve so as to maintain a high combustion stability, to avoid a high level of $NO_x$ emissions or to avoid engine knocking. These operating modes can be classified by the current supply management strategy as being unsuitable for the generation of electrical energy because a low energy conversion efficiency level is prevailing. On the other hand, operating modes in which a MBT ignition advance is obtained by means of calibration are favorable for the generation of energy since it is possible to obtain more energy in relation to the operation from a mass unit of fuel.

The classification of the operating mode as being favorable or unfavorable for the generation of energy can be performed in that calibration instructions are examined and calibration experts are consulted in order to identify operating modes in which either an MBT ignition advance setting is always or frequently selected or in which the ignition advance is considerably decelerated. During the operation of the vehicle, the favorable or unfavorable operating modes are identified simply by means of monitoring the control input signals and the status reports of the drivetrain. If specific conditions (e.g. engine rotational speed, throttle flap position etc.) occur that indicate an operating mode or controller strategy that is regarded as being favorable or unfavorable, a voltage set point of the electric generator is selected that either promotes or hinders the generation of energy.

It is possible for a preferred process of implementing the minimal current supply management strategy in the case of a motor vehicle having an Otto engine to differentiate between the efficiency levels in the no-load situation, after a start-up from an extended no-load situation, forward thrust (at a constant velocity or accelerated, but not a start-up from the no-load situation), throttle flap fully open and non-fired decelerations. Of these situations, the no-load situation, start-up from an extended no-load situation and throttle flap fully open are classified as operating modes having a low energy conversion efficiency level. The other operating modes, namely forward thrust with acceleration or constant velocity are classified as operating modes having a high energy conversion efficiency level.

Figure 5:
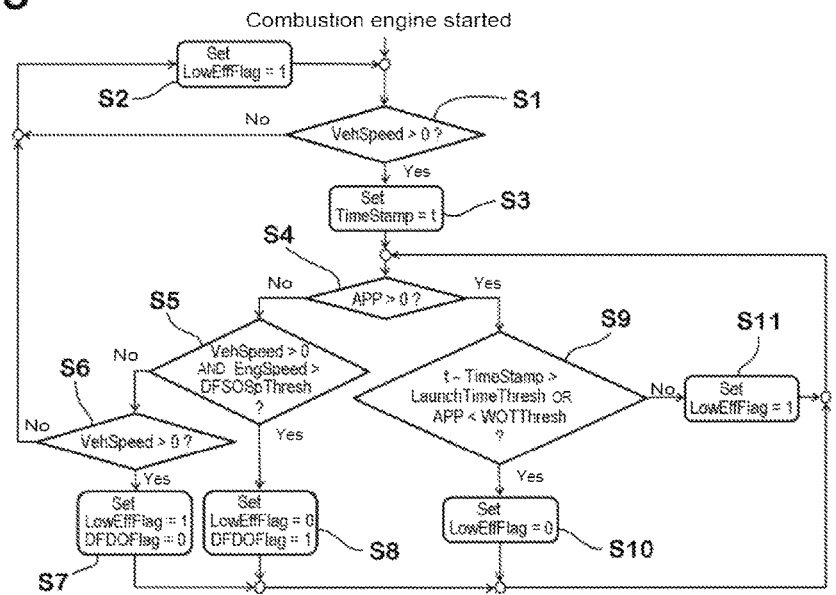
FIG. 5 illustrates the process of determining the operating mode according to the efficiency level in the case of a drivetrain that is driven by an Otto engine.

FIG. 5 illustrates an algorithm that determines the operating mode according to the efficiency level in the case of a drivetrain that is driven by an Otto engine. The process of identifying these operating modes including non-fired decelerations requires the knowledge regarding the accelerator position (APP in FIG. 5), the vehicle velocity (VehSpeed in FIG. 5) and the engine rotational speed (EngSpeed in FIG. 5). The engine rotational speed can be estimated with reference to the vehicle velocity and the positions of the gear selector and clutch pedal that have been selected by the driver or the gear controller.

The output variables of the algorithm for the identification of the operating mode according to the efficiency level are the flags LowEffFlag and DFSOFlag. The calibrated parameters DFSOSpThresh and WOTThresh are compared with the engine rotational speed in order to determine whether a non-fired deceleration occurs or whether the accelerator pedal is depressed sufficiently far down in order to identify an operation with a fully open throttle flap. The flag LowEffFlag and DFSOFlag are used by the algorithms illustrated in FIGS. 3 and 4 for the selection of the voltage set point in order to determine the voltage set point that is transmitted as a command to the electric generator.

In particular, a check is performed in conjunction with FIG. 5 after the engine start-up as to whether the vehicle velocity VehSpeed is greater than zero (S1). If no, the LowEffFlag is set to 1 (S2), and the step S1 is repeated. If yes, the prevailing time point t is stored (S3) as a time stamp TimeStamp and a check is performed as to whether the accelerator pedal position APP is greater than zero (S4). If no, a check is performed as to whether the vehicle velocity VehSpeed is still greater than zero and simultaneously the engine rotational speed EngSpeed is greater than DFSOSpThresh (S5). If no, a check is performed as to whether the vehicle velocity VehSpeed is still greater than zero (S6). If no, the process returns to step S2. If yes, the LowEffFlag is set to 1 and is and DFSOFlag is set to 0 (S7) and the process returns to step S4. In the case of yes in step S5, the LowEffFlag is set to 0 and the DFSOFlag is set to 1 (S8) and the process returns to step S4. In the case of yes in step S4, a check is performed as to whether the difference between the prevailing time point t and the time stamp TimeStamp set in step S3 is greater than a threshold value LaunchTimeThresh or whether the accelerator pedal position APP is less than WOTThresh (S9). In the case of yes in step S9, the LowEffFlag is set to 0 (S10) and the process returns to step S4. In the case of no in step S9, the LowEffFlag is set to 1 (S11) and the process returns to step S4.

A similar set of conditions can be set up for a diesel engine in order to identify operating modes having a low level of efficiency and a high level of efficiency and non-filed decelerations, and the operating modes can be identified according to the efficiency level as in the case of an Otto engine with reference to the accelerator pedal position, the positions of the gear selector and coupling pedal and also the vehicle velocity as input variables.

The strategy for electrical robustness monitors the charge state of the battery with the aid of a flag LowSOCFlag for the low charge state and starts charging the battery at a relatively high voltage set point (Setpoint1 in FIG. 2) if a low charge state is identified. The strategy for electrical robustness can be divided into three functions: identification of a low charge state, management (setting and resetting) of the mitigation process and of the flag LowSOCFlag, and control of the voltage set point for charging the battery.

A conventional battery monitoring sensor that is mounted in the terminal niche can be used in order to continuously monitor the charge state of the battery. The estimated charge state that is transmitted to the strategy can be compared with a calibrated threshold value by means of the function for the management of a low charge state in order to activate or deactivate the mitigation strategy.

Identification of a low charge state by means of an algorithm for the identification of a low charge state.

As an alternative, the minimal current supply management strategy described herein can be implemented in conjunction with an algorithm that does not require a conventional battery monitoring sensor in order to estimate the charge state. Algorithms of this type monitor the output variable(s) of the source for the electrical current in the motor vehicle (of the electric generator) during periodic or sporadic transitions from one voltage set point to another and the same transitions from relative high voltage set points to relative low voltage set points that are implemented in order to improve the energy conversion efficiency level, as described above, can also be used for the purpose of estimating the charge state.

An algorithm of this type and preferred for this purpose is an algorithm for the discrete identification of a low charge state, said algorithm estimates the battery state without using a conventional battery monitoring sensor or by measuring the battery current, renders possible a discrete identification of the battery charge state with reference to a flag that is output by the algorithm and said flag indicates whether the charge state is below or above a calibrated threshold value.

If an algorithm of this type for the discrete identification of a low charge state, also referred to hereinunder as the discrete algorithm, is implemented in conjunction with the minimal current supply management strategy described herein, the transitions from relatively high voltage set points to relatively low voltage set points occur if the energy conversion efficiency level of the drivetrain changes from high to low or if a recuperation phase in one operating mode terminates with a low energy conversion efficiency level. The transitions and the charge state are checked in this case sporadically as a function of the driving cycle. The algorithm for the discrete identification of a low charge state can generate periodic voltage reductions if a transition does not occur over a long period of time, as can be the case if the vehicle is operated at speed on a motorway. As long as the guidelines are followed that in the above section "Selection of the voltage set point of the electric generator with regard to the operating mode according to the efficiency level" and in the subsequent section "Flag for the low charge state and mitigation management" and the current source (the electric generator) is not saturated, it is not necessary to monitor the charge state frequently.

The discrete algorithm identifies a low charge state by means of monitoring the battery current during a transition from a relatively high voltage set point to a relatively low voltage set point during a calibrated time period. This time period must be so long that the capacitive elements of the equivalent switching model of the battery can be completely discharged in the event that the charge state of the battery is less than the calibrated threshold value. This threshold value for the charge state is a function of the relatively low voltage set point that is represented by means of the voltage set point for operating modes having a low energy conversion efficiency level.

In the event that the charge state of the battery exceeds the calibrated threshold value, the battery must discharge itself and must not start to recharge during the calibrated monitoring time period that commences at the transition of the voltage set point from the relatively high voltage set point to the relatively low voltage set point. In order to be able to identify the charge state as being above the calibrated threshold value, it is therefore possible during the monitoring time period to measure only the discharging current. This corresponds to the condition that the flag LowSOCFlag is set to 0. Otherwise, if it is detected that the battery is charging, the charge state is identified as being below the calibrated threshold value and the flag LowSOCFlag is set to 1.

Figure 6A:
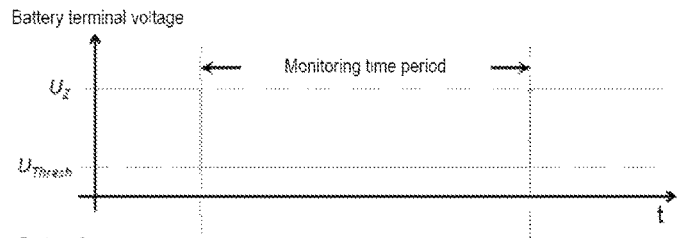
FIGS. 6A-6C illustrate the battery terminal voltage and the battery current during a monitoring time period for a battery having a charge state that is above and below the calibrated threshold value.
Figure 6B:
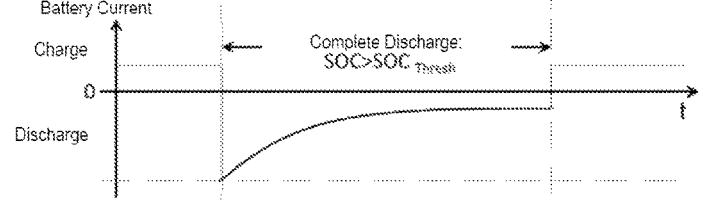
Figure 6C:
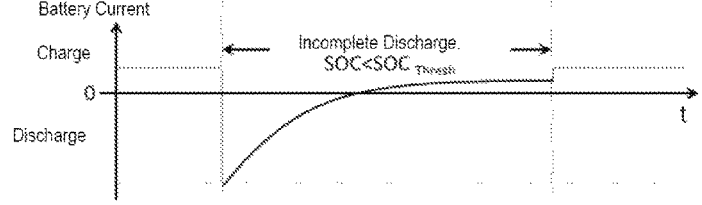

FIGS. 6A to 6C illustrate the battery terminal voltage and the battery current during a monitoring time period for a battery having a charge state above and below the calibrated threshold value. FIG. 6a illustrates an example for a battery terminal voltage that changes during the voltage set point control between a value $U_Z$, which corresponds to the temperature dependent compensating charge voltage, and a value $U_{Thresh}$ that corresponds to the calibrated threshold value $SOC_{Thresh}$. FIG. 6b illustrates the resulting battery current for a battery having a charge state SOC above the calibrated threshold value $SOC_{Thresh}$. FIG. 6c illustrates the resulting battery current for a battery having a charge state SOC below the calibrated threshold value $SOC_{Thresh}$. At the commencement of the monitoring time period, the battery discharges itself with a current that is determined by means of the values of the resistive and capacitive elements of the equivalent switching model of the battery.

The battery current can be measured directly by means of a Hall effect sensor, or it can be indirectly monitored with the aid of the output current or duty cycle of the electric generator. Since the internal resistance of the battery is essentially smaller than that of an electric generator, after a transition from a relatively high to a relatively low voltage set point it supplies all loads until the no-load voltage is equal to the low voltage set point. In this time point, the electric generator supplies all loads, in that said electric generator follows the load. Yet, if the output current of the electric generator is zero, or if its duty cycle is at a minimal value, it can be assumed that the battery is currently being discharged. In this manner, it is possible to indirectly monitor the battery current by means of the signals that characterize the output current of the electric generator and that are generally always available on the CAN bus in the vehicle.

Different strategies for the mitigation of a low charge state can be achieved depending upon whether a low charge state is identified using a conventional battery monitoring sensor that is mounted in the terminal niche and directly estimates the charge state or whether an algorithm for the discrete identification of a low charge state is used, said algorithm indirectly monitoring the battery current, as described above.

A part of the strategy for the mitigation of a low charge state is the management of the flag for a low charge state (LowSOCFlag) including its reset conditions. The flag for a low charge state should be stored in a non-volatile memory so that mitigation can occur over more than one driving phase. The reason for this is that journeys frequently do not last long enough to charge a battery.

Mitigation resides in charging the battery with a temperature-dependent voltage that is sufficient in order to achieve a full charge in all the cells. As is illustrated in FIG. 1, the voltage set point is not changed with regard to the operating mode of the drivetrain according to an efficiency level during a mitigation of a low charge state. On the contrary, a relatively high voltage set point is applied that corresponds to the temperature-dependent Z-curve that is referred to in FIG. 2 as the Setpoint1. As described above in connection with the selection of the voltage set point of the electric generator with regard to the operating mode according to the level of efficiency, the Z-curve corresponding to the Setpoint1 describes a temperature-dependent voltage characteristic curve that is used in order to fully charge a starter battery using a conventional strategy for controlling the current supply. It can be defined by the battery manufacturer or by the vehicle manufacturer.

Flags for the low charge state and the mitigation management by means of a conventional battery management system If a conventional battery monitoring sensor that is mounted in the terminal niche is used, the flag LowSOCFlag can be set in that the charge state that is estimated by means of the sensor is compared with a calibrated threshold value LowSOCThresh. The condition low charge state' can be eliminated in that the charge state is compared with a second threshold value HighSOCThresh that can be calibrated sufficiently higher than the LowSOCThresh in order to avoid a swing between the set and non-set condition 'low charge state'.

Figure 7:
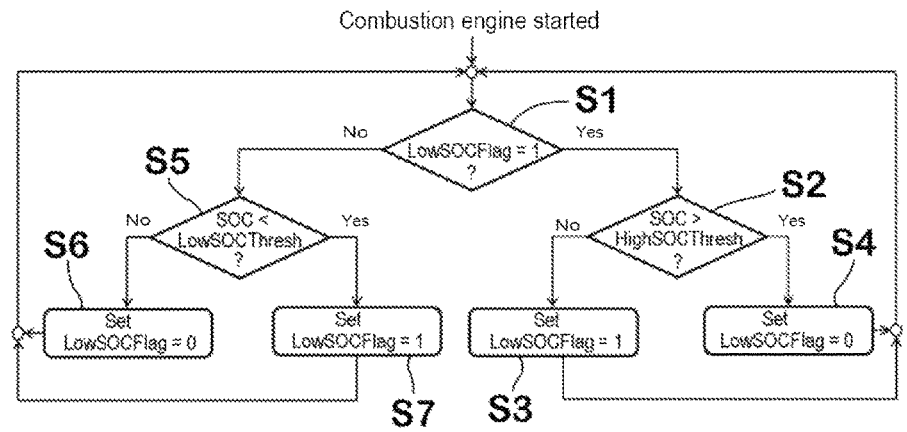
FIG. 7 illustrates the management of the flag LowSOC-Flag in the case of the minimal current supply management strategy described herein using a battery monitoring sensor.

FIG. 7 illustrates the management of the flag LowSOC-Flag in the case of the minimal current supply management strategy described herein using the output variable of a conventional battery monitoring sensor that is mounted in the terminal niche.

If the flag LowSOCFlag is activated and mitigation occurs, only a relatively high temperature-dependent voltage set point is used that is referred to in FIG. 2 as the Setpoint1. Otherwise, relatively low or higher voltage set points can be used in order to hinder or promote the process of charging the battery, as described in the above section "Selection of the voltage set point of the electric generator with regard to the operating mode according to the efficiency level".

In particular, a check is performed in conjunction with FIG. 7 after the engine start-up as to whether the LowSOC-Flag is equal to 1 (S1), and if yes, a check is performed as to whether the charge state SOC is higher than HighSOCThresh (S2). If no, the LowSOCFlag continues to remain at 1 (S3), and the process returns to step S1. If yes, the LowSOCFlag is set to 0 (S4), and the process returns to the step S1. If no in step S1, a check is performed as to whether the charge state SOC is less than LowSOCThresh (S5). If yes, the LowSOCFlag continues to remain at 1 (S6) and the process returns to the step S1. If no, the LowSOC-Flag is set to 0 (S7) and the process returns to step S1.

Flag for the low charge state and mitigation management by means of the algorithm for the discrete identification of a low charge state If the algorithm described further above for the discrete identification of a low charge state is used in order to monitor the battery charge state, the flag LowSOCFlag can be set directly by means of the identification algorithm. In this case, a relatively high temperature-dependent voltage set point is applied, as referred to in FIG. 2 as Setpoint1, until the condition low charge state' is eliminated by means of the mitigation strategy.

There are two options for eliminating the condition low charge state'. The algorithm for the discrete identification of a low charge state can be applied periodically in conjunction with short-term reductions in the voltage set point. During and after the voltage transitions from high to low, the algorithm can be used in order to determine whether the charge state has again exceeded the calibrated threshold value for the low charge state. If this strategy for the mitigation management is used, the charging state threshold value that is used in order to eliminate the condition 'low charge state', should be calibrated considerably higher than the threshold value that is used in order to identify a low charge state in order to avoid a swing between the set and non-set condition 'low charge state' and to improve the robustness.

A preferred mitigation strategy that can be used in conjunction with the discrete identification of a low charge state is to perform the charging process with a relatively high temperature-dependent voltage set point, and in fact to do so during a long, calibrated time period EqChargePeriod. Mitigation by means of performing the charging process during a long, predefined time period can also be applied to embodiments having a conventional battery monitoring sensor, described above.

The calibrated charge time period EqChargePeriod for the mitigation of a low charge state can be referred to as the compensating charge time period since it should be sufficiently long in order to charge all cells of the battery uniformly to 100% of their capacity. The compensating charge time period should have a value of multiple hours and will normally comprise multiple journeys. In order to be able to follow the time that has been spent with the mitigation, the value of the charge time period EqChargeTime that is measured by the time that is used in the case of the management strategy should be stored in a non-volatile memory.

Figure 8:
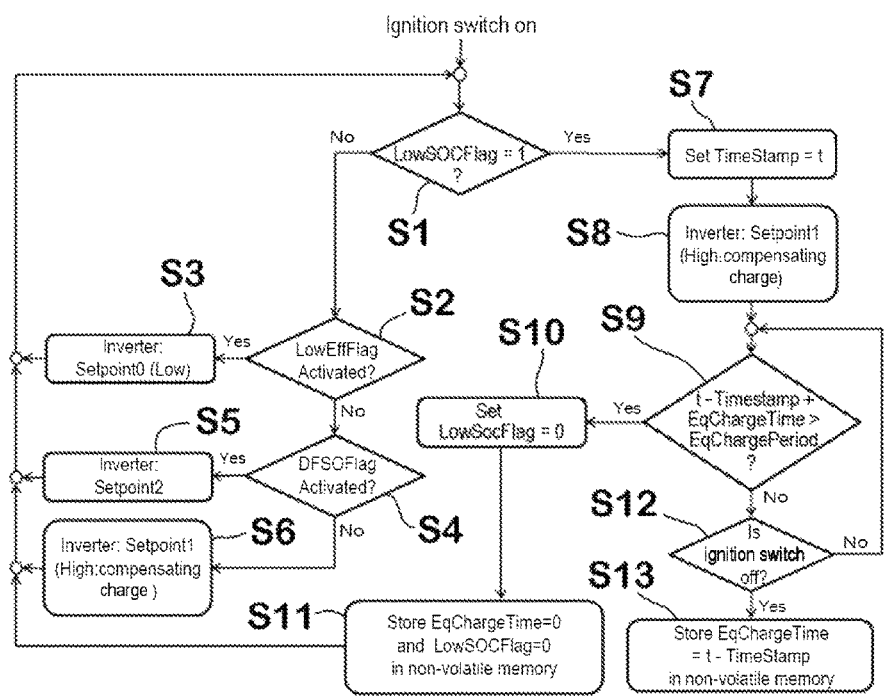
FIG. 8 illustrates an example for a complete minimal current supply management strategy.

FIG. 8 illustrates a complete minimal current supply management strategy using a strategy for the mitigation of a low charge state that manages the charge time period using a timer. It is assumed that the condition low charge state' is identified using the above described algorithm for the discrete identification of a low charge state and that the flag for the low charge state (LowSOCFlag) and the compensating charge time period (EqChargeTime) are initially set to 0.

The minimal current supply management strategy illustrated in FIG. 8 combines the strategy for improving the energy conversion efficiency level with the strategy for the mitigation of a low charge state.

The conditions of the flag LowEffFlag used in the flow chart in FIG. 8 for the low level of efficiency and of the flag DFSOFlag for the highest level of efficiency that characterizes a deceleration in the case of the fuel supply being switched off are determined by means of the algorithm that is illustrated in FIG. 5 for the identification of the operating mode according to the efficiency level.

After switching on the vehicle ignition switch in order to start the combustion engine, a check is initially performed in step S1 in FIG. 8 as to whether the flag LowSOCFlag is set to 1.

If no, mitigation is not required and the strategy for improving the energy conversion efficiency level is used. For this purpose, a check is performed as to whether the flag LowEffFlag is activated (S2). If yes, the comparatively low voltage set point Setpoint0 is selected (S3). If no, a check is performed as to whether the flag DFSOFlag is activated (S4). If yes, the very high voltage set point Setpoint2 is selected (S5). If no, the voltage set point Setpoint1 is selected (S6) that lies between the Setpoint0 and Setpoint1. This corresponds in the result to the selection strategy that is illustrated in FIG. 4. The electric generator is operated with the selected voltage set point in order to achieve the optimal energy conversion efficiency level, the process continues with step S1.

In the event that step S1 in FIG. 8 indicates that the flag LowSOCFlag is not set to 1, the prevailing time point t is set as a time stamp TimeStamp (S7) and the comparatively high voltage set point Setpoint1 is selected for the compensating charge process with which the electric generator is being operated (S8). A check is subsequently performed as to whether the time (t−TimeStamp) that has lapsed since the step S7 plus the compensating charge time period EqChargeTime is greater than the compensating charge time period EqChargePeriod (S9). If yes, the flag LowSOCFlag is set to 0 (S10) and the values EqChargeTime=0 and LowSOCFlag=0 are stored in a non-volatile memory (S11). If no, a check is performed as to whether the vehicle ignition switch is switched off (S11). If no, the check is repeated in step S9. If yes, the value EqChargeTime=t−TimeStamp is stored in the memory (S12).

In other words, in order to mitigate a low charge state, the battery is charged using a relatively high voltage over the predetermined time period EqChargePeriod, and this is also continued if the journey has been interrupted. The strategy for improving the energy conversion efficiency level is further applied only when the mitigation process is terminated, said strategy generating an optimal charging voltage for the energy conversion efficiency level.

In one variant of the strategy illustrated in FIG. 8, it is possible in step S8 as an alternative to select the quite high voltage set point Setpoint2 if a regenerative braking operation is currently being performed, in other words, if the flag DFSOFlag is activated. However, Setpoint2 could be less favorable if the battery is almost completely charged.

If the strategy illustrated in FIG. 8 for a motor vehicle without a regenerative braking system is to be used, the steps S5 and S4 are simply omitted and the process moves from step S2 directly to step S6.

The minimal current supply management strategy described herein can be performed in the case of any type of motor vehicle that is driven by a combustion engine in order to improve the fuel consumption and reduce the pollutant emissions. The identification of the efficiency level operating modes that are used in order to determine the voltage set point of the electric generator should be performed along the lines of the engine control strategies that can be operating modes having different efficiency levels that can occur during the operation of the vehicle.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method for managing current supply in a vehicle comprising:
   in response to a discrete variable generated using a battery monitoring sensor indicating that a charge state of a battery is less than a calibrated threshold value, charging the battery using a voltage setpoint over a predetermined time period such that cells of the battery are charged to a target; and
   in response to the discrete variable indicating that the charge state is greater than the calibrated threshold value, setting a voltage setpoint for an electric generator based on a parameter indicative of drivetrain efficiency and a parameter indicative of temperature of the battery.

2. The method as claimed in claim 1 further comprising monitoring current of the battery during a transition from a higher voltage set point to a lower voltage set point during a predetermined time period to determine whether the discrete variable indicates that the charge state is less than or greater than the calibrated threshold value.

3. The method as claimed in claim 1, wherein the voltage setpoint for the electric generator is further set based on whether the vehicle is decelerating.

4. The method as claimed in claim 1 further comprising determining the parameter indicative of drivetrain efficiency based on an accelerator pedal position, a velocity of the vehicle, and a rotational speed of an engine.

5. The method as claimed in claim 1 further comprising using a stored value for the discrete variable from a last drive cycle upon restart of the vehicle.

6. The method as claimed in claim 1, wherein the parameter indicative of drivetrain efficiency is a binary parameter.

7. The method as claimed in claim 1, wherein the discrete variable is a binary parameter.

8. A method comprising:
   by a controller,
      responsive to a discrete variable generated using a battery monitoring sensor indicating state of charge (SOC) less than a threshold, operating a generator at a voltage setpoint for a predetermined duration such that battery cells are charged to a target; and
      responsive to the discrete variable indicating SOC greater than the threshold, operating the generator at a voltage setpoint set according to drivetrain efficiency and battery temperature.

9. A method for management of electrical current supply in a vehicle having a combustion engine, wherein a charge state of a battery that can provide current for a starter, ignition and lighting is detected and characterized as a discrete variable generated using a battery monitoring sensor that indicates whether the charge state is below or above a calibrated threshold value, the method comprising:
   if the discrete variable indicates that the charge state is below the calibrated threshold value, charging the battery using a voltage setpoint over a predetermined time period in such a manner that cells of the battery are charged; and
   if the discrete variable indicates that the charge state is above the calibrated threshold value, in dependence upon a drivetrain energy conversion efficiency level that is detected and characterized as a further discrete variable, setting different temperature-dependent voltage set points of an electric generator in the vehicle.

10. The method as claimed in claim 9, wherein the temperature-dependent voltage set points in addition comprise a function for operation of the battery as an energy buffer for a regenerative braking operation, wherein the voltage set point is selected not only with reference to the further discrete variable that characterizes the drivetrain energy conversion efficiency level as being low or high but rather also with reference to a further discrete variable that characterizes the drivetrain energy conversion efficiency level as very high as a result of deceleration of the vehicle without fuel supply.

11. The method as claimed in claim 10, wherein the drivetrain energy conversion efficiency level is identified as being low, high or very via monitoring of accelerator pedal position, vehicle velocity, and engine rotational speed.

\* \* \* \* \*